United States Patent

Kauffman

[15] 3,671,919

[45] June 20, 1972

[54] PROTECTIVE CLIP AND ELECTRONIC ASSEMBLY USING THE SAME

[72] Inventor: Samuel L. Kauffman, Newtown, Pa.

[73] Assignee: Burroughs Corporation, Detroit, Mich.

[22] Filed: Feb. 9, 1971

[21] Appl. No.: 113,975

[52] U.S. Cl. ................................339/19, 339/17 R, 339/222

[51] Int. Cl. ..........................................................H01r 31/08

[58] Field of Search................339/19, 17, 18, 222, 242, 256, 339/275, 258; 317/101 CC; 24/259 FS, 259 PF, 255 TC, 81 PC, 81 T

[56] References Cited

UNITED STATES PATENTS

| | | | |
|---|---|---|---|
| 2,150,497 | 3/1939 | Fernberg | 24/259 TF |
| 3,149,893 | 9/1964 | Dupre | 339/14 |
| 3,319,216 | 5/1967 | McCullough | 339/176 |
| 3,319,166 | 5/1967 | Coleman | 324/158 |
| 1,807,100 | 5/1931 | Graff et al. | 24/259 X |

FOREIGN PATENTS OR APPLICATIONS

| | | | |
|---|---|---|---|
| 1,259,992 | 2/1968 | Germany | 339/17 R |

*Primary Examiner*—Joseph H. McGlynn
*Assistant Examiner*—Robert A. Hafer
*Attorney*—Kenneth L. Miller, Robert A. Green, George L. Kensinger and Charles S. Hall

[57] ABSTRACT

An electronic module which comprises a printed circuit board, on which is mounted an MOS integrated circuit module, utilizes a resilient, stainless steel clip secured to the edge of the board to short out the conductive circuit runs to the integrated circuit module and to mask them from the solder bath in a wave soldering machine through which the printed circuit board is passed.

5 Claims, 3 Drawing Figures

INVENTOR.
SAMUEL L. KAUFFMAN
BY Robert A. Green
ATTORNEY

PROTECTIVE CLIP AND ELECTRONIC ASSEMBLY USING THE SAME

BACKGROUND OF THE INVENTION

Some semiconductor devices, and particularly those known as MOS (metal oxide semiconductor) integrated circuits, are sensitive to static electricity and the like and are easily damaged in handling. Manufacturers of such devices take elaborate precautions to shield the leads with conductive foam packing material, and manufacturers of modules using these devices provide relatively complicated grounding elements for their handling apparatus to protect these devices. The prior art provides no relatively simple protective device which can be used to protect an MOS integrated circuit module during manufacture, which includes mounting and soldering operations, and during shipping.

SUMMARY OF THE INVENTION

Briefly, apparatus embodying the invention comprises a resilient clip specially designed to provide intimate and protective contact with conductive runs on a printed circuit board to insure the shorting out of the runs, the clip being of a material to which solder does not adhere.

DESCRIPTION OF THE PREFERRED EMBODIMENTS

Figure 1:
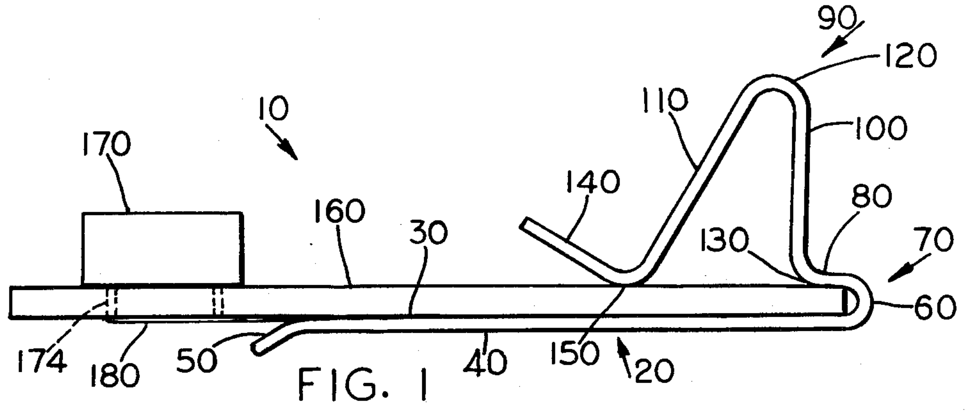
FIG. 1 is a sectional, elevational view of a printed circuit board carrying a circuit element and the clip of the invention.
Figure 2:
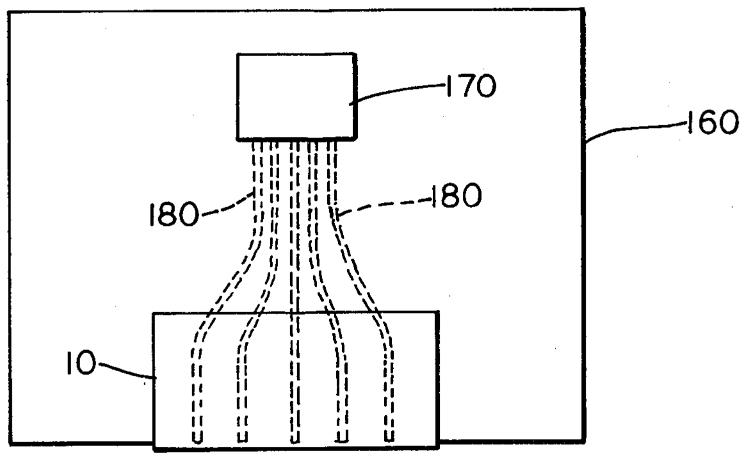
FIG. 2 is a plan view of the board and clip shown in FIG. 1.

A protective device or clip 10 embodying the invention is preferably made of a metal such as stainless steel which can withstand heat and to which solder will not adhere. The clip includes a first relatively large-area flat plate 20 having a top surface 30, a bottom surface 40, and a leading edge 50 bent downwardly from the horizontal plane to permit insertion of a printed circuit board in a manner to be described. The remote edge 60 of the first large-area plate is bent back upon itself to form a U-shaped portion 70 including a wall 80 which lies parallel to the first plate 20. This U-shaped portion 70 continues into a second U-shaped portion 90 which includes two walls 100 and 110 and a curved connecting portion 120. The second U-shaped portion 90 faces the large-area plate 20, and the joint between the walls 80 and 100 forms a contact edge or surface 130 which faces the surface 30 of the large-area plate 20. The wall 110 forms a "V" with a wall 140, and the apex of the V forms a second contact edge or surface 150 which faces plate 20.

The protective clip 10 is intended for use with a printed circuit board 160 which has, among other things, an MOS integrated circuit module 170 mounted thereon with its terminals 174 connected to conductive runs 180 which terminate at an edge of the printed circuit board. The clip 10 is mounted on the board with the large-area plate 20 in contact with, and shorting out, the conductive runs 180 from the module 170 and with one edge of the board in contact with the U-shaped member 70 and with the two contact surfaces 130 and 150 bearing against the opposite surface of the printed circuit board. The two contact surfaces 130 and 150 provide sure and effective pressure of the clip on the board to compensate for any variations in the board structure and thereby insure positive contact of the large-area plate 20 with all of the runs 180 from the module 170 to be protected.

Figure 3:
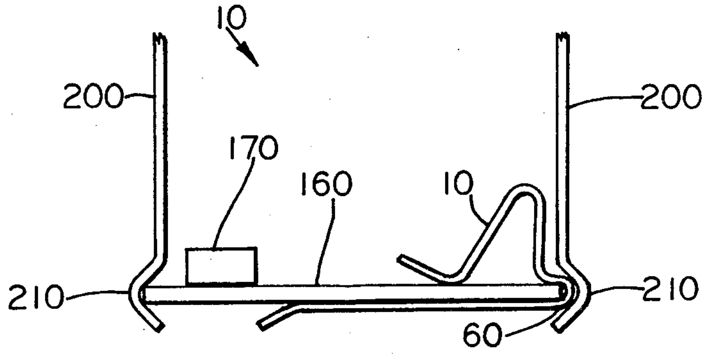
FIG. 3 is a side, elevational view of the apparatus of FIG. 1 carried by the arms of a wave soldering machine.

The clip 10 protects the leads of the module 170 during handling of the printed circuit board and during the operation of soldering all parts to the printed circuit board. This operation is usually performed in a wave soldering machine. Since the clip is of stainless steel, the solder does not adhere to it. It is to be noted that the length of wall 80 of U-shaped portion 70 is dimensioned to permit the board 160 to be carried by the traveling arms of a wave soldering machine. Thus, wall 80 is of sufficient length so that wall 100 is spaced a suitable distance from the edge 60 to accommodate the soldering machine holder arms. A typical arrangement is shown in FIG. 3 where the solder machine arms 200 include V-shaped portions 210, one of which receives the U-shaped portion 70 of clip 10 and the other of which receives the opposite edge of the printed circuit board 160.

What is claimed is:

1. An electronic module comprising
   a printed circuit board carrying electronic components and an integrated circuit package secured to conductive runs on said board, said circuit package being sensitive to static electricity, and
   a protective clip coupled to said printed circuit board and covering and electrically shorting said conductive runs to said circuit package, said clip comprising
   a first large-area, flat plate and a second plate resiliently coupled thereto with a spring-like action,
   said second plate including at least two contact surfaces positioned adjacent to said first large-area plate for making two lines of contact with said printed circuit board inserted between said first and second plates whereby said clip intimately engages said board and said first large-area plate intimately contacts all of said conductive runs.

2. The module defined in claim 1 wherein said clip is made of a material to which solder does not adhere and which does not melt at soldering temperatures.

3. The module defined in claim 2 wherein said clip is made of stainless steel.

4. An electronic module comprising
   a printed circuit board carrying electronic components and an integrated circuit package secured to conductive runs on said board, said circuit package being sensitive to static electricity, and
   a protective clip coupled to said printed circuit board and covering and electrically shorting said conductive runs to said circuit package, said clip comprising
   a first large-area, flat plate and a second plate resiliently coupled thereto with a spring-like action,
   said second plate including a U-shaped portion including two walls and a connecting wall, said two walls having curved ends which face and are spaced adjacent to said large-area plate, said connecting wall being positioned remote from said curved ends of said two walls and said first plate, said curved ends of said two walls comprising contact surfaces which provide two lines of contact with said printed circuit board inserted between said first and second plates.

5. An electronic module comprising
   a printed circuit board carrying electronic components and an integrated circuit package secured to conductive runs on said board, said circuit package being sensitive to static electricity, and
   a protective clip coupled to said printed circuit board and covering and electrically shorting said conductive runs to said circuit package, said clip comprising
   a first large-area, flat plate,
   a second plate resiliently coupled thereto with a spring-like action, a first generally U-shaped portion interconnecting said first plate and said second plate, said second plate including a second generally U-shaped portion which includes first and second walls and a connecting wall, said first wall having a first curved end which extends into a wall of said first U-shaped portion, said second wall having a second curved end, said first curved end of said first wall and said second curved end of said second wall lying in substantially the same plane and comprising two contact surfaces positioned adjacent to said first large-area plate and adapted to provide two lines of contact with said printed circuit board inserted between said first and second plates.

* * * * *